United States Patent [19]
Sato et al.

[11] Patent Number: 5,677,530
[45] Date of Patent: Oct. 14, 1997

[54] SCANNING ELECTRON MICROSCOPE

[75] Inventors: Mitsugu Sato; Ryuji Hoya, both of Hitachinaka; Yoichi Ose, Mito, all of Japan

[73] Assignee: Hitachi, Ltd., Tokyo, Japan

[21] Appl. No.: 668,177

[22] Filed: Jun. 21, 1996

[30] Foreign Application Priority Data

Jun. 26, 1995 [JP] Japan .................. 7-159444

[51] Int. Cl.$^6$ .................. H01J 37/28
[52] U.S. Cl. .................. 250/310; 250/307
[58] Field of Search .................. 250/310, 307

[56] References Cited

U.S. PATENT DOCUMENTS

5,387,793  2/1995  Sato et al. .................. 250/310
5,448,064  9/1995  Matsuyama et al. .................. 250/310

Primary Examiner—Jack I. Berman
Attorney, Agent, or Firm—Kenyon & Kenyon

[57] ABSTRACT

A scanning electron microscope comprising an objective lens for forming lens magnetic field on the sample side, and observing the image of the sample after detecting the secondary electrons from the sample on the upper side of the objective lens is disclosed. The accelerating electrode is arranged along the electron beam passage of the objective lens, and an positive potential is applied thereto. The electric field correction electrode is disposed outside the accelerating electrode or to the sample side. A negative potential is applied to the electric field correction electrode. An image observation with high resolution also is realized even when the sample is inclined.

8 Claims, 7 Drawing Sheets

SCANNING ELECTRON MICROSCOPE

BACKGROUND OF THE INVENTION

1. Field of the Invention

This invention is related to a scanning electron microscope, and particularly to a scanning electron microscope having a mechanism for including.

2. Description of the Prior Art

As a method for obtaining a high resolution image by a scanning electron microscope, conventionally have been known a method of so-called an inlens type wherein a sample is disposed between magnetic poles of an objective lens and a method wherein an outer size of a magnetic pole in the objective lens is made smaller than an inner size of the objective lens, and the lens magnetic field is generated on the side of the sample by protruding an under surface of the inner magnetic pole to the sample side as same as the under surface of the outer magnetic pole or more.

As is described in U.S. Pat. No. 4,713,543, also known is a method for reducing an aberration of the objective lens wherein a high positive potential is applied by arranging electrodes in axisymmetry on an electron beam passage from an electron beam gun to the objective lens, and wherein energy of a primary electrons beam at the time of passing the objective lens is made higher than another energy (final accelerating voltage) at the time of reaching the sample. In the above method, a secondary electrons generated from the sample is wound up by the magnetic field of the objective lens or is accelerated by an applied voltage of the electrode arranged in the electron beam passage of the objective lens, and as a result, the secondary electrons moves to the upper part of the objective lens (the electronic source side). Therefore, it is necessary to detect the secondary electrons on the upper part of the objective lens. Especially, in the objective lens generating the lens magnetic field on the sample side, the secondary electrons that moves to the upper part of the objective lens emanates when the magnetic field of the objective lens extincts.

To detect such a secondary electrons efficiently, the electrode (accelerating electrode) for accelerating the secondary electrons is arranged to the primary electrons beam passage of the magnetic pole of objective lens, and a positive voltage is applied. However, in the above prior art, an electric field occurs between the sample and the accelerating electrode by the positive voltage applied to the electrode (accelerating electrode) that accelerates the secondary electrons, or by another positive voltage applied to the electrode (accelerating electrode) that accelerates the primary electrons beam for the purpose of reducing the aberration.

When the sample is not inclined, the electric field between the accelerating electrode and the sample becomes axisymmetric. Consequently, due to the effects of the electric field and the magnetic field of the objective lens, the secondary electrons occurred from the sample is efficiently guided to a secondary electrons detector on the upper part of the objective lens. When the sample is inclined, a distance between the accelerating electrode and the sample changes and places of a strong electric field and a weak one occur. Therefore, the secondary electrons is deflected in the direction that orthogonalizes an optic axis. As a result, there is a fault that the secondary electrons generated from the sample does not reach the secondary electrons detector arranged on the upper part of the objective lens by colliding with a wall on the way of passing the objective lens. This as asymmetric field becomes a cause of the aberration. When the electrode is arranged along the electron beam passage of the objective lens magnetic pole, a diameter of the lower part of the objective lens (horizontal part) becomes large. Therefore, when the sample is inclined by wide angles high angle, the distance (working distance) between the under surface of the objective lens and the sample become long, so that a resolution power reduces. On the other hand, an arranging the electrode to the lower part of the objective lens and an application of a negative voltage to this electrode are disclosed in Japanese Patent Granted Print No. 60-9543 for example. Because the purpose of the above method is energy discrimination of the secondary electrons, it is necessary to make the voltage of the electrode 0 (zero) v in the image observation of ordinary secondary electrons without energy discrimination, the emanation of the secondary electrons after the magnetic field of the objective lens extincts cannot be repressed.

SUMMARY OF THE INVENTION

A main object of this invention is to provide a scanning electron microscope, which detects a secondary electrons occurred from a sample on the upper part of an objective lens, that realizes a short working distance having a high resolution observation without reducing an efficiency of the secondary electrons detection even if the sample is inclined.

Another object of this invention is to realize an automatic high resolution observation even when such an observation condition of the sample as an accelerating voltage of a secondary electrons beam or inclination angle is changeable.

A main feature of this invention is that an electrode for correcting an electric field is disposed outside the accelerating electrode of the secondary electrons close to the sample or a sample side, and a negative voltage is applied to this electrode for correcting the electric field.

Another feature of this invention is to automatically change the voltage to be applied to the above electrode in response to the voltage applied to the accelerating electrode of the above secondary electrons or the inclined angle in the above sample.

The above objects, features, other objects and features of this invention are explained according to following examples.

DESCRIPTION OF THE PREFERRED EMBODIMENT

Before explaining a concrete constitution of this invention, the principle of this invention is explained. When a sample is inclined, a deflection of a secondary electrons by an electric field generated between an accelerating electrode to which a positive voltage is applied and the sample is offset by the deflection effect of the electric field occurred between the electric field correction electrode, which is arranged on the same axis with accelerating electrode, a negative voltage and the sample. Therefore, the secondary electrons is not deflected between the electrode and the sample, and the secondary electrons can enter the accelerating electrode without deflecting. As the internal electric potential of the accelerating electrode is axisymmetric, the secondary electrons entered into the accelerating electrode is accelerated without deflecting in the orthogonal direction of the optic axis. Therefore, the secondary electrons can be detected in the same state as the sample is not inclined.

Figure 2A:
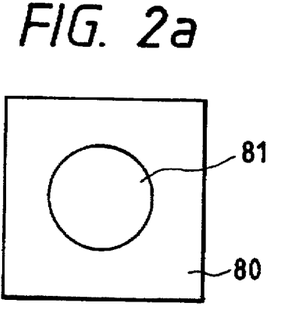
FIGS. 2a 2b and 2c are an explanation of an influence give by an accelerating electrode and an electrode for correcting electric field on an image pickup sight.
Figure 2B:
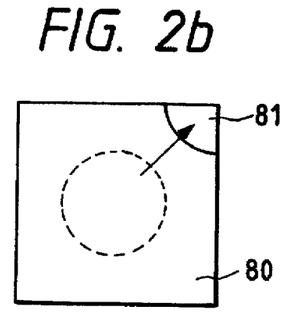
Figure 2C:
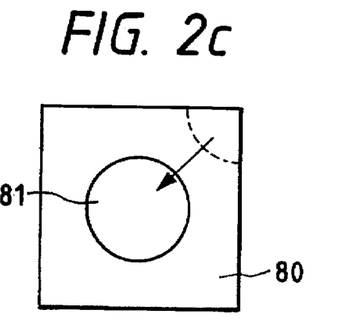

FIGS. 2a to 2c explain the above by the change of an image pickup sight of a scanning electron microscope. A conventional scanning electron microscope is shown in FIG. 2a which has the accelerating electrode, but does not have the electric field correction electrode of this invention, wherein image pickup sight 80 when the inclination angel of the sample is zero, and light area 81 is in the sight center. When the sample is inclined in this state, light area 81 is deviated from the center of sight 80 as is shown by an arrow in FIG. 2b. This is because the electric field between the accelerating electrode and the sample becomes nonaxisymmetric by inclining the sample so that the secondary electrons occurred from the sample is deflected by the nonobjective electric field. However, when both the electric field correction electrode and the accelerating electrode are disposed and the negative voltage is applied to the electric field correction electrode, light area 81 that has deviated to the corner of the sight moves toward the sight center as shown by arrow in FIG. 2c. When the negative voltage is set to a proper value, light area 81 can return to the sight center again, so that the sample can be observed under the similar condition of FIG. 2a.

In the case where the electric field correction electrode is provided, even if the sample is inclined, an electric potential distribution close to a beam irradiation point of the sample does not become asymmetrical so that there is an advantage that an astigmatism about a primary electrons beam is repressed. A deflection action of the secondary electrons produced at the time of the sample inclination depends on the applied voltage of the accelerating electrode closest to the sample. When the negative voltage applied to the electric field correction electrode is responsive to the applied voltage of the accelerating electrode, the voltages are controlled so that a predetermined relationship (relationship to offset the deflection action of the secondary electrons) comes into existence. By the above relationship, highly efficient secondary electrons detection can be done without deflection action by the secondary electrons at the time of the sample inclination, even though the applied voltage of the accelerating electrode is changed according to an accelerating voltage or working distance.

When the accelerating electrode closest to the sample among the electrodes is constituted by a magnetic body so as to function as a magnetic pole of an objective lens, a lower diameter of the objective lens can be made smaller, and high resolution power is obtained because of shortening the working distance at the time of the sample inclination.

This invention is explained in detail by a concrete example as follows.

Figure 1:
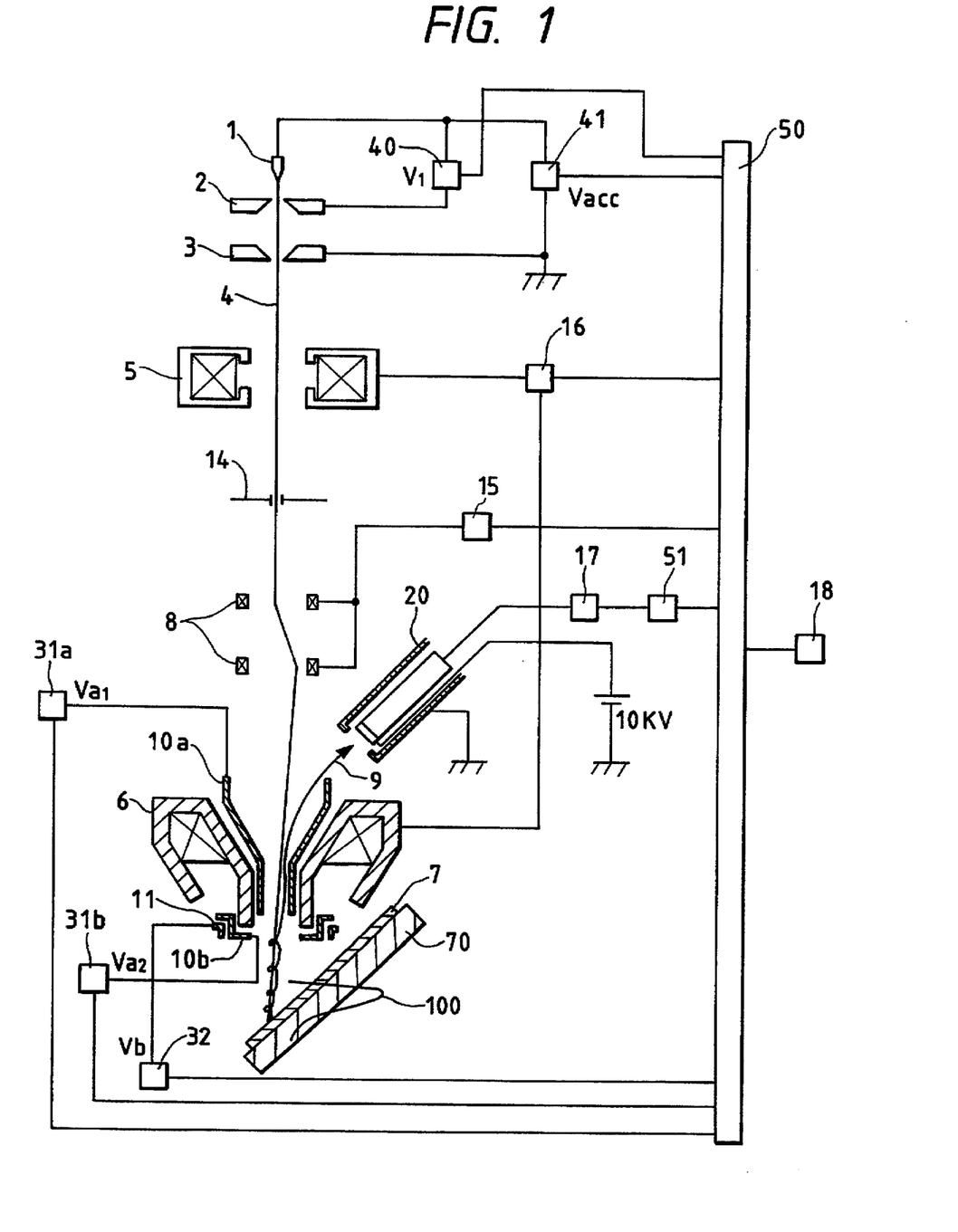
FIG. 1 shows a schematic cross-sectional view of an example of this invention.

FIG. 1 is a structure diagram of an example of the scanning electron microscope according to the present invention. Voltage V1 is applied between cathode 1 and first anode 2 from high-voltage control power source 40 controlled by micro processor (CPU) 50, and a fixed emission current is drawn from cathode 1. Accelerating voltage Vacc is applied between cathode 1 and secondary anode 3 from a high-voltage control power source controlled by CPU 50, and primary electrons beam 4 emitted from cathode 1 is accelerated to voltage Vacc. Primary electrons beam moves towards the lens system in the later step. Primary electrons beam 4 is focused onto sample 7 as a minute spot by focusing lens 5 and objective lens 6 that are controlled in lens control power 16, and primary electrons beam 4 is scanned two-dimensionally with deflection coil 8 on the surface of sample 7. The scanning signal of deflection coil 8 is controlled by deflection control circuit 15 according to an observation magnification. The focusing angle (beam divergence angle) of the primary electrons beam is decided by throttle 14 of the objective lens. Sample stage 70 that supports sample 7 is provided with functions for moving the sample in a horizontal direction and for inclining the sample.

Axisymmetric accelerating electrodes 10a and 10b are arranged on an electron beam passage of objective lens 6, to which positive voltages Va1 and Va2 are applied by voltage control power sources 31a and 31b. After primary electrons beam 4 is further accelerated by voltages Va1 and Va2 applied to accelerating electrodes 10a and 10b, primary electrons beam 4 is decelerated to former energy (Vacc) between objective lens 6 and sample 7 and is irradiated to sample 7. The magnetic pole of objective lens 6 has a hole diameter of an outer magnetic pole which is larger than that of an inner magnetic pole and the tip of the inner magnetic pole is more protruded to the sample than that of the outer magnetic pole, so as to generate lens magnetic field 100 at the sample side. When positive voltages Va1 and Va2 are applied to accelerating electrodes 10a and 10b, respectively, primary electrons beam 4 passes through objective lens magnetic field 100 with energy higher than Vacc, so that the lens aberration is reduced.

Secondary electrons 9 generated from sample 7 by irradiating electron beam 4 is trapped by the magnetic field of objective lens 6 and moves towards the upper side of the objective lens. After being accelerated by accelerating electrode 10b, the electron is focused by the action of an electrostatic lens formed in the gap between accelerating electrode 10a and accelerating electrode 10b. Therefore, secondary electrons 9 does not emanate in the area where not influenced by the magnetic field of the objective lens, and secondary electrons 9 is detected by secondary electrons detector 20 after moving towards the upper part of objective lens 6. The electrostatic lens can be formed in the boundary area even when either voltage Va1 or Va2 is higher or both are equal. Voltages Va1 and Va2 are set suitably according to the values of accelerating voltage Vacc and the value of the working distance. The signal of secondary electrons detector 20 is taken into image memory 51 through signal amplifier 17 and is displayed as an expansion image of the sample on image display 18. Each control circuit controlling the components of the electronic optic system and the control power source are central-controlled by above CPU 50.

Axisymmetric electric field correction electrode 11 is arranged to the outside of accelerating electrode 10b provided to objective lens 6 and is applied with negative voltage Vb by control power 32. Voltage Vb of electric field correction electrode 11 is set to the value so as to offset the deflection action resulted from accelerating electrode 10b when sample 7 is inclined. The relationship between Vb and Va2 that offsets the deflection action of this secondary electrons can be in advance determined by experiments or simulation and can be set by control CPU 50 to fulfill the relationship.

Figure 3:
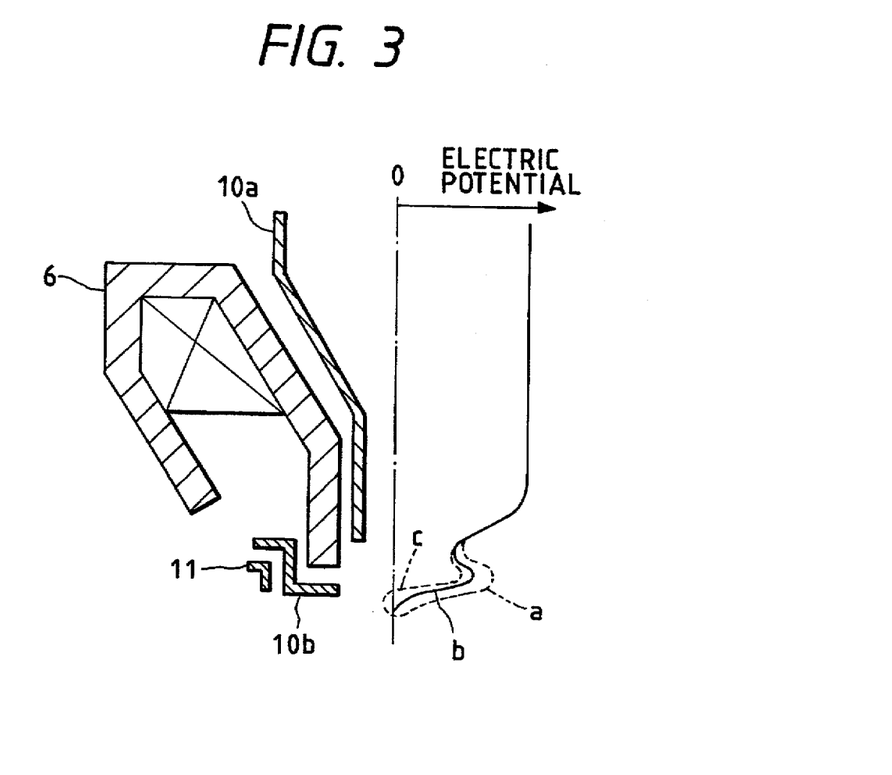
FIG. 3 shows an electric potential distribution on the optic axis.
Figure 4:
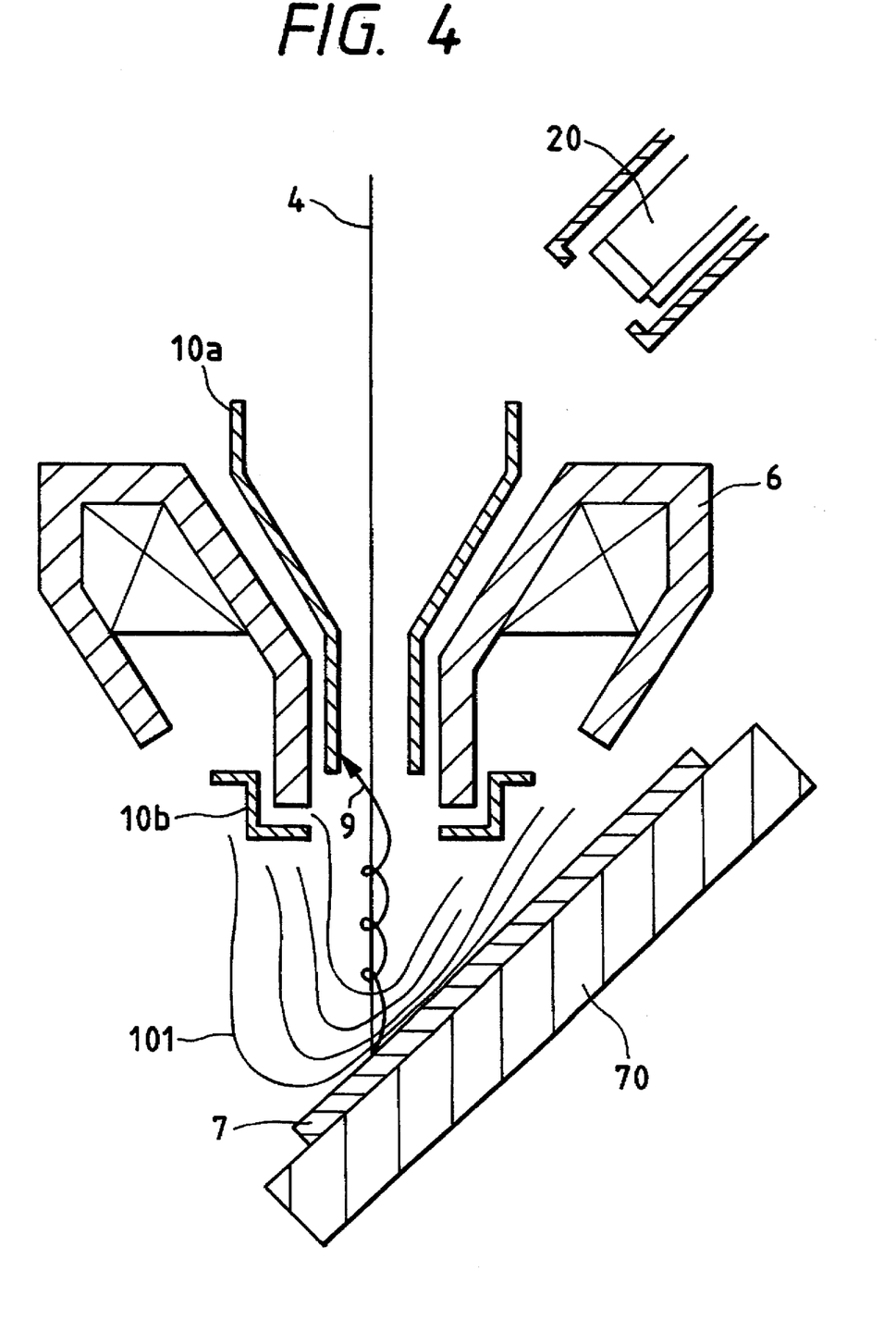
FIG. 4 is an explanation figure of an equipotential distribution and a secondary electrons orbit when no electrode for correcting electric field is disposed.
Figure 5:
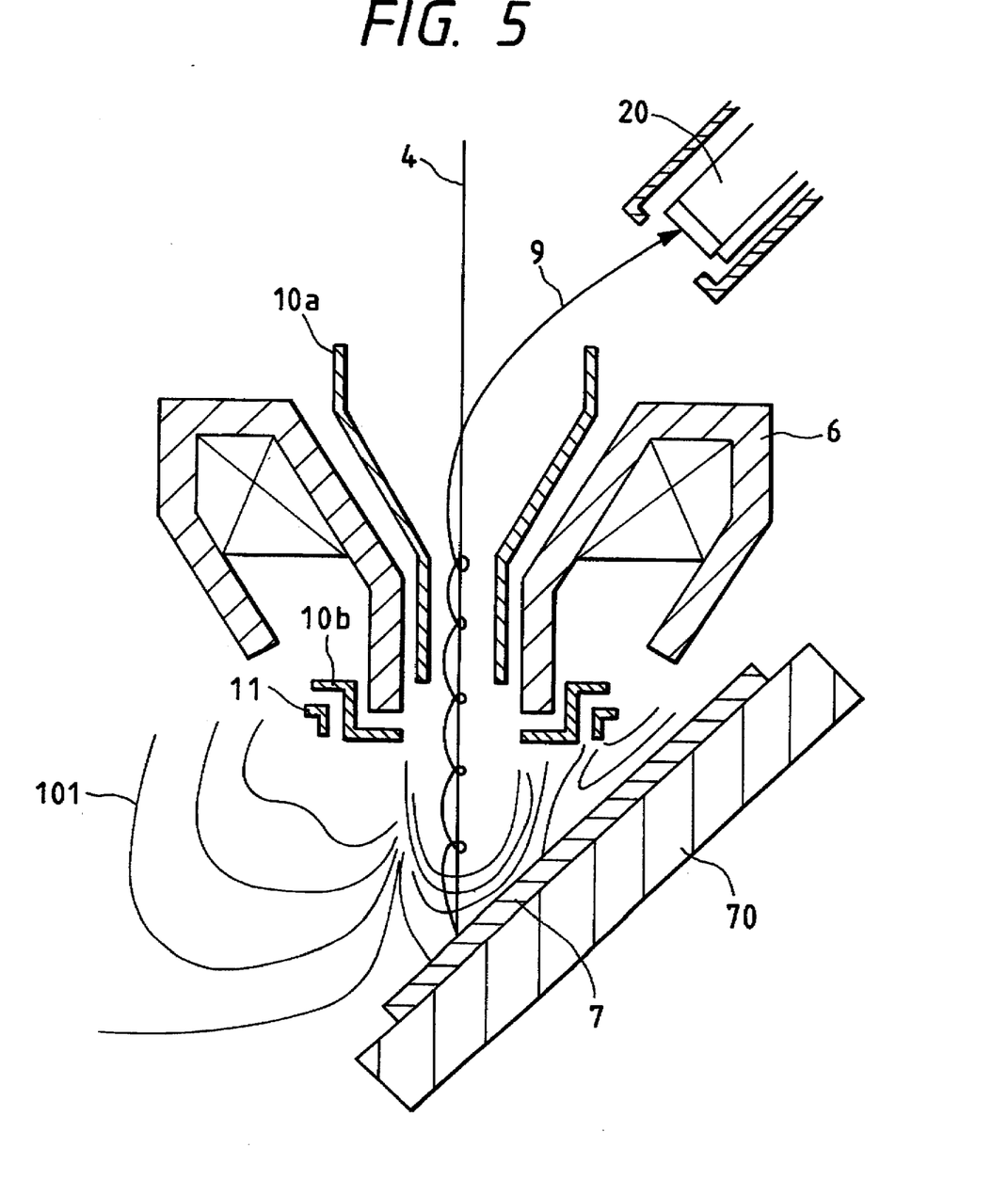
FIG. 5 is an explanation figure of an equipotential distribution and a secondary electrons orbit when a negative voltage is applied to the electrode.

The action of electric field correction electrode 11 is explained according to FIG. 3, FIG. 4 and FIG. 5.

FIG. 3 shows a cross section of the objective lens at the left side and the electric potential distribution on the optic axis o at the right. The electric potential of the position of sample 7 is 0 (zero). The electric potential on the optic axis o close to sample 7 changes according to voltage Vb applied to electric field correction electrode 11. The area where the electric potential gradient exists acts as the electrostatic lens, and the area conducts the action that focuses the secondary electrons occurred from sample 7. Curve a in the figure shows the electric potential distribution when there is no electric field correction electrode 11. The electric potential distribution on the optic axis o changes as shown by curves b and c as the absolute value of negative voltage Vb applied to electric field correction electrode 11 increases. Curve b shows the electric potential distribution when the value of voltage Vb is proper and curve c the electric potential distribution when the absolute value of voltage Vb is too large, respectively. Because the area where the electric potential becomes negative is formed on the optic axis o in electric potential distribution c, the secondary electrons occurred from the sample cannot be pumped up into objective lens 6, therefore the secondary electrons cannot be detected.

FIG. 4 shows an equipotential lines at the time of the sample inclination without electric field correction electrode 11. As is shown in FIG. 4, when there is no electric field correction electrode 11, equipotential lines 101 at the time of the sample inclination becomes asymmetrical because the equipotential lines protrudes in the inclined direction of sample 7. Therefore, secondary electrons 9 occurred from sample 7 is not only accelerated in the direction of the optic axis, but also receives a deflection action in the orthogonal direction (direction of sample inclination) of the optic axis. As a result, almost all of secondary electrons 9 collide with inner wall of accelerating electrodes 10a and 10b, and do not reach secondary electron detector 20.

FIG. 5 shows equipotential lines 101 at the time of the sample inclination, wherein electric field correction electrode 11 is arranged outside accelerating electrode 10b and negative voltage Vb is applied. As negative voltage Vb is applied to electric field correction electrode 11, a direction of the secondary electrons deflected by negative voltage Vb at the time of the sample inclination is opposite to a direction of accelerating electrode 10b deflected by positive voltage Va2. Consequently, by selecting the value of voltage Vb so as to offset the deflection action between the secondary electrons of negative voltage Vb and secondary electrons of positive voltage Va2, the axisymmetry of the electric potential distribution of the sample vicinity of both electrodes is improved as shown in FIG. 5. Secondary electrons 9 move towards the upper part of objective lens 6 and is detected efficiently by secondary electron detector 20 without being deflected in the direction that secondary electrons 9 orthogonalize the optic axis.

Figure 6:
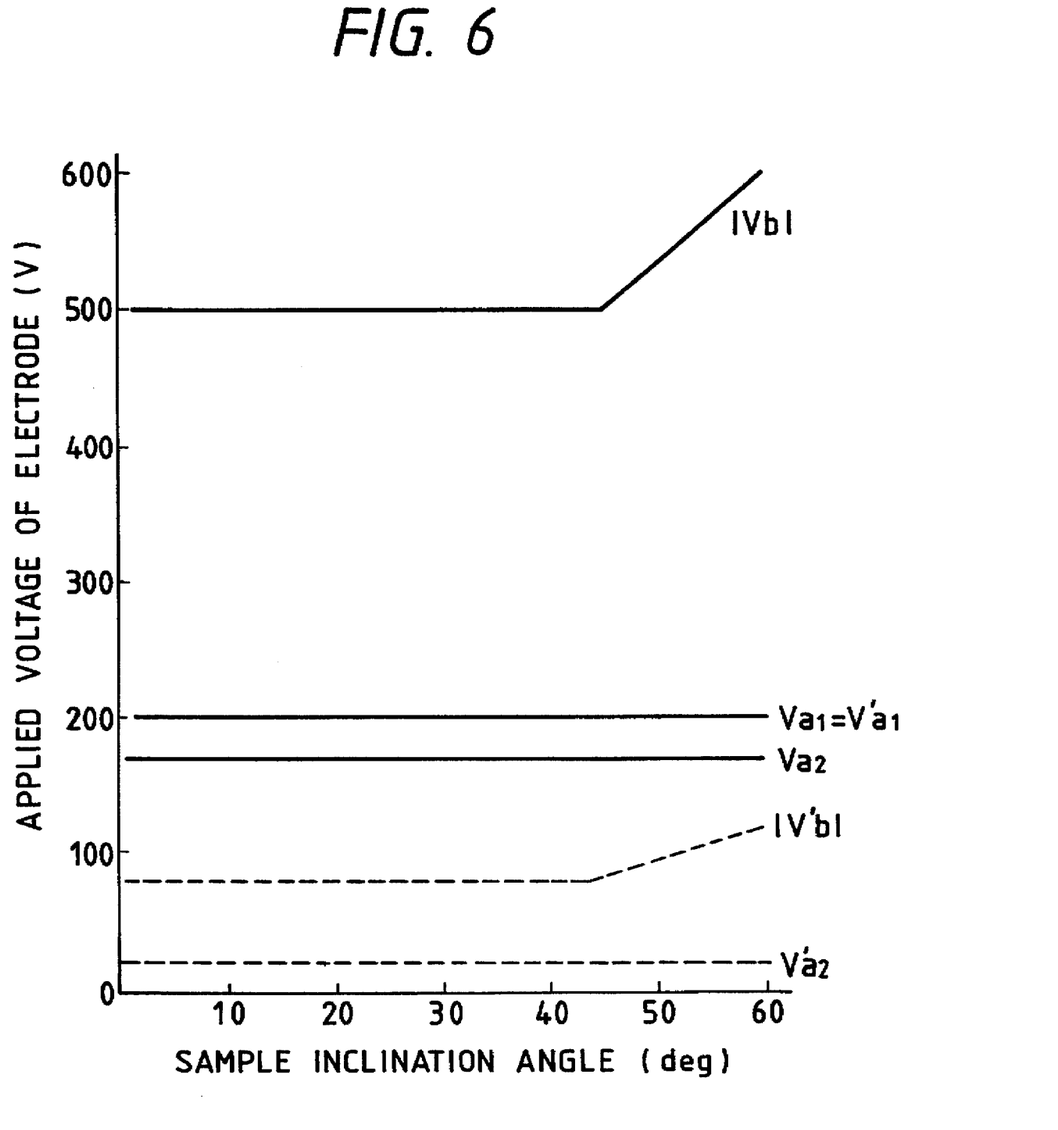
FIG. 6 shows a relationship between a sample inclination angle and an applied voltage to each of the electrodes.

FIG. 6 is a diagram showing an example of the applied voltage to each electrode, wherein the vertical axis shows the applied voltage of the electrode and the horizontal axis shows sample inclination angle. FIG. 6 also shows the relationship between voltage Va1, Va2 and Vb that are applied to each of electrodes 10a, 10b and 11 and the sample inclination angle when accelerating voltage Vacc is 1 kV. It also shows the relationship between voltage V'a1, V'a2 and V'b that are applied to each of electrodes 10a, 10b and 11 and the sample inclination angle when acceleration voltage Vacc is 10 kV. While voltages Vb and V'b are negative, the values are shown by absolute values for simplification in FIG. 6. When accelerating voltage Vacc is 1 kV, a magnetic field intensity of the objective lens that is necessary for focusing the primary electrons beam is small and the magnetic field intensity leading the secondary electrons, which occurred from the sample, to the secondary electron accelerating electrode of the objective lens is also weak. Therefore, applied voltage Va2 of secondary electron accelerating electrode 10b closest to the sample needs to set to the value higher than value V'a2 to compensate for the weakness of the magnetic field of objective lens 6 when the accelerating voltage is 10 kV. That is, voltage Vb of electric field correction electrode 11 is set to be high when accelerating voltage Vacc is 1 kV, but is set to low value V'b when accelerating voltage Vacc is 10 kV.

Since optimum value of the applied voltage of secondary electron accelerating electrode 10b depends on both the distance between sample 7 and accelerating electrode 10b and the strength of the magnetic field between them, the optimum condition is found out for every accelerating voltage Vacc and the working distance. On the other hand, applied voltage Vb of electric field correction electrode 11 depends on applied voltage Va2 of accelerating electrode 10b closest to sample 7, and after deciding applied voltage Va2 to accelerating electrode 10b, the optimum value is determined so as to avoid the loss of the secondary electrons due to the sample inclination. As applied voltage Va1 to other accelerating electrode 10a that are not close to the sample does not change in accordance with accelerating voltage Vacc and the working distance, applied voltage Va1 can be made a constant value. This is because the energy of secondary electrons 9 does not depend on accelerating voltage Vacc or the working distance.

In the case where the sample inclination angle is in the range from 0 (zero) to around 45°, even if applied voltage Vb to electric field correction electrode 11 is made constant, the secondary electrons occurred from the sample is efficiently guided to secondary electron detector 20 so that a high resolution image can be obtained. However, when further enlarging the sample inclination, it is useful for highly efficient detection of the secondary electrons to control voltage Vb applied to electric field correction electrode 11 according to the sample inclination angle, as is shown in FIG. 6.

The relationships described above can be obtained by experiments or numerical value simulations and can be memorized in the form of relational expressions or of tables. The relationships include:

(1) Optimum value Va2 for accelerating voltage Vacc and the working distance;

(2) Relationship between Va2 and Vb to offset the deflection action of the secondary electrons at the time of the sample inclination; and (3) Optimum voltage Vb applied to the large sample inclination angle. CPU 50 most suitably controls power 31b and 32 by referring to those relational expressions or tables.

Next, explained is another example of the accelerating electrode and the electric field correction electrode that are arranged along the electron beam passage of the objective lens.

Figure 7:
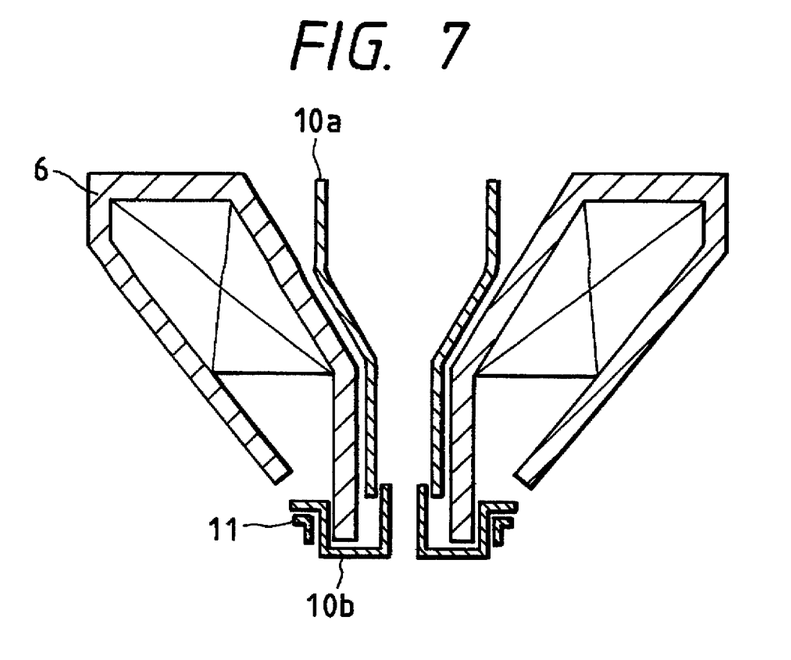
FIG. 7 and FIG. 8 show other examples of accelerating electrodes and electric field correction electrodes.

FIG. 7 is an example of accelerating electrodes 10a and 10b that are overlapped partially. In this case, it is necessary to make a difference between applied voltage Va1 to accelerating electrode 10a and applied voltage Va2 to accelerating electrode 10b to form the electrostatic lens at the boundary between both accelerating electrodes 10a and 10b.

Figure 8:
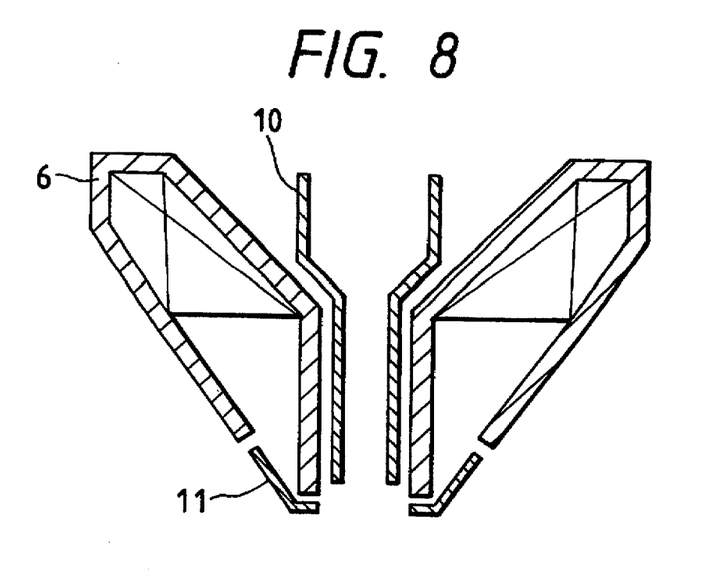

FIG. 8 is an example wherein one accelerating electrode 10 is disposed along the electron beam passage of objective lens 6. In this case, electric field correction electrode 11 is positioned below the inner magnetic pole of objective lens 6. In case of this example, there is a limit of the function that suppresses an emanation of the secondary electrons, the range of corresponding accelerating voltage Vacc or the working distance is limited. In this example, the flexibility of adjustment is limited as compared with a case that 2 or more accelerating electrodes are disposed, but a high resolution observation can be done in the state that the sample is inclined as same as other examples.

Figure 9:
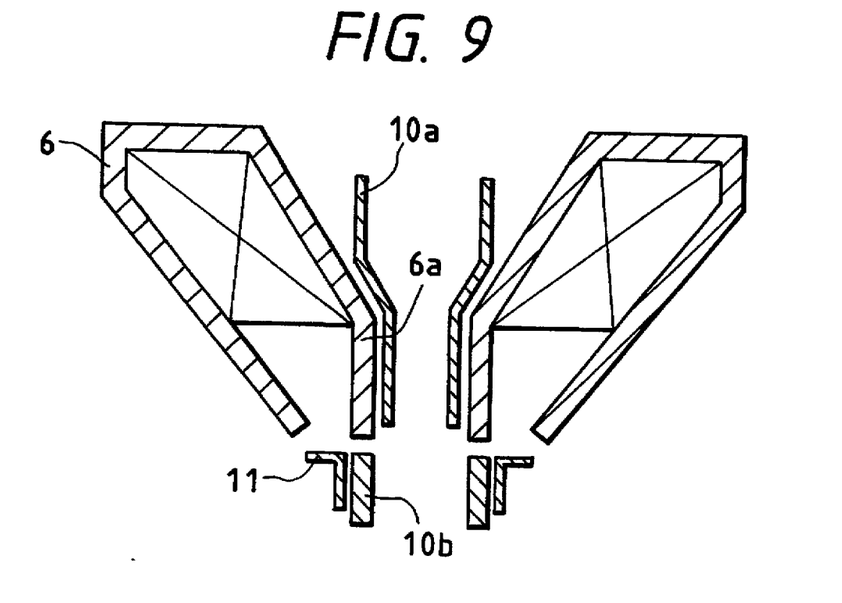
FIG. 9 shows an example wherein an accelerating electrodes are constituted by a magnetic body.
Figure 10:
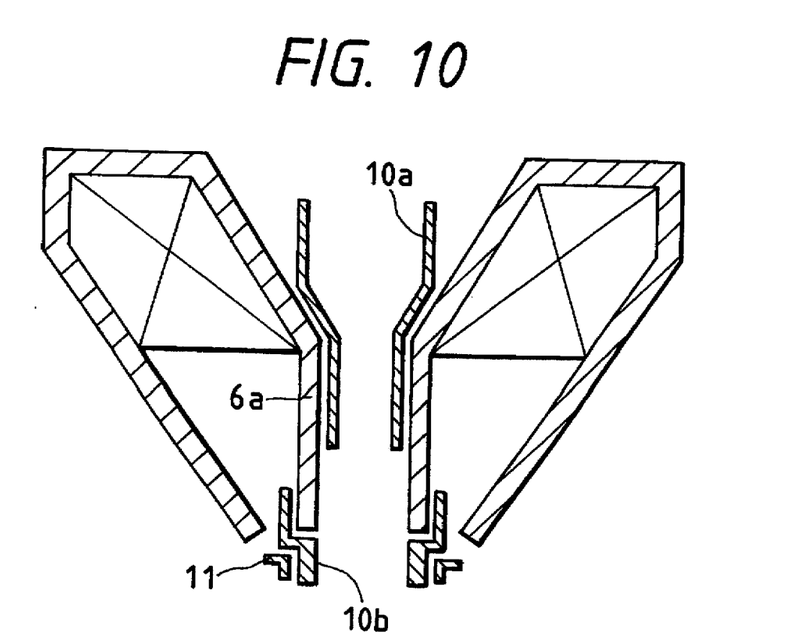
FIG. 10 shows another example wherein accelerating electrodes are constituted by a magnetic body.

FIG. 9 is an example of accelerating electrode 10b constituted by a magnetic body. This electrode 10b of magnetic body is connected magnetically with inner magnetic path 6a of objective lens 6, and it functions as the inner magnetic pole of objective lens 6. Electric field correction electrode 11 is arranged so as not to disturb the inclination of the sample at outer electrode 10b of magnetic body. According to this example, the under surface of accelerating electrode 10b becomes the lower surface of the objective lens, and the high resolution observation can be done in a short working distance even if the sample is inclined. As shown in FIG. 10, magnetic pole 10b of magnetic body can be made a structure that covers an upper part with inner magnetic path 6a for improving the assembling precision of objective lens 6 to inner magnetic path 6a.

According to this invention, the short working distance can be realized even if the sample is inclined by wide angles, and a lens aberration can be made small. Since a high detection efficiency of the secondary electrons is acquired, the high resolution observation can be done by inclining the sample by wide angles.

What is claimed is:

1. A scanning electron microscope comprising a focusing lens system for focusing a primary electron beam irradiating a sample, an electron beam deflecting device for scanning said primary electrons beam two-dimensionally on said sample, a passage of said primary electrons beam, an objective lens for forming a magnetic field on said sample side, and a sample stage with a mechanism for inclining said sample placed on said sample stage;

wherein said scanning electron microscope comprises:
at least one accelerating electrode arranged on an electron beam passage of said objective lens;
a power source for applying a positive voltage to said accelerating electrode;
an electric field correction electrode that is arranged outside a part of said accelerating electrode closest to said sample or is arranged to said sample side; and
a power source for applying a negative voltage to said electric field correction electrode.

2. The scanning electron microscope according to claim 1, wherein said accelerating electrode is symmetrically formed with respect to the center axis on said electron beam passage.

3. The scanning electron microscope according to claim 1, wherein a plurality of accelerating electrodes are disposed along said electron beam passage or to said sample side, and said electric field correction electrode is arranged outside of said accelerating electrode the nearest to said sample.

4. The scanning electron microscope according to claim 3, wherein an accelerating electrode positioned closest to said sample in said accelerating electrodes is constituted by a magnetic body thereby to add an objective lens function.

5. The scanning electron microscope according to claim 1, wherein said electric field correction electrode is symmetrically formed with respect to the center axis on said electron beam passage.

6. The scanning electron microscope according to claim 1, wherein said electric field correction electrode is changed according to the voltage applied to said accelerating electrode.

7. The scanning electron microscope according to claim 3, wherein a applied voltage of said electric field correction electrode is changed according to said applied voltage of said accelerating electrode closest to said sample.

8. The scanning electron microscope according to claim 1, wherein an applied voltage of said electric field correction electrode is changed according to said inclined angle of said sample stage.

* * * * *